United States Patent [19]

Gademann et al.

[11] Patent Number: 4,661,835
[45] Date of Patent: Apr. 28, 1987

[54] SEMICONDUCTOR STRUCTURE AND METHOD OF ITS MANUFACTURE

[75] Inventors: Lothar Gademann, Rottenburg; Johann Tschepella, Reutlingen, both of Fed. Rep. of Germany

[73] Assignee: Robert Bosch GmbH, Stuttgart, Fed. Rep. of Germany

[21] Appl. No.: 671,554

[22] Filed: Nov. 15, 1984

[30] Foreign Application Priority Data

Jan. 17, 1984 [DE] Fed. Rep. of Germany ....... 3401404

[51] Int. Cl.[4] .......................................... H01L 23/48
[52] U.S. Cl. ...................................... 357/68; 357/74; 357/81; 357/65; 29/589
[58] Field of Search ...................... 357/68, 74, 80, 81, 357/65; 29/589

[56] References Cited

U.S. PATENT DOCUMENTS

| | | | |
|---|---|---|---|
| 3,584,265 | 6/1971 | Nier | 357/65 |
| 3,689,985 | 9/1972 | Nier | 29/589 |
| 3,711,752 | 1/1973 | Nier | 357/68 |
| 3,715,633 | 2/1973 | Nier | 357/68 |
| 3,720,999 | 3/1973 | Nier | 29/587 |
| 4,128,802 | 12/1978 | Gansert et al. | 174/52 H |
| 4,285,003 | 8/1981 | Gaicki | 357/68 |

FOREIGN PATENT DOCUMENTS

| | | | |
|---|---|---|---|
| 52-73675 | 6/1977 | Japan | 357/68 |
| 58-56428 | 4/1983 | Japan | 29/589 |

*Primary Examiner*—Andrew J. James
*Assistant Examiner*—Mark Prenty
*Attorney, Agent, or Firm*—Frishauf, Holtz, Goodman & Woodward

[57] ABSTRACT

To prevent damage upon removal of a locating templet used in positioning a plate-like semiconductor on a support carrier (2, 14), for example a base plate (2) of a transistor housing or a metallized surface of a ceramic insulator (14), the locating templet (9) is made of solderable material, positioned with respect to the carrier structure by interengaging projection-and-recess elements (10, 10', 11) and soldered to the carrier in one soldering operation, the templet remaining on the carrier structure and forming part of the semiconductor element. If the carrier structure is the metallized coating of a ceramic, the templet may then be used as a terminal connection point for a connection or bonding wire connected to an internal portion of a connection pin extending through the housing of the semiconductor structure.

14 Claims, 7 Drawing Figures

SEMICONDUCTOR STRUCTURE AND METHOD OF ITS MANUFACTURE

REFERENCE TO RELATED PATENTS:

U.S. Pat. No. 3,584,256;
U.S. Pat. No. 3,720,999;
U.S. Pat. No. 3,689,985;
U.S. Pat. No. 3,715,633;
U.S. Pat. No. 3,711,752;
U.S. Pat. No. 4,128,802.

The present invention relates to a semiconductor structure, and more particularly to a semiconductor element or chip located within a metal housing, and a method of its manufacture which is economical, rapid, and positively locates a semiconductor element or chip within the housing.

BACKGROUND

Many types of semiconductor elements are known in which a disk or plate-like semiconductor body or chip is located within a housing; some of those chips are directly soldered to a metallic base which may form part of the housing—see, for example, the referenced U.S. Pat. No. 3,584,265. It is also known to secure a plate-like semiconductor element within a metallic housing to a metallic socket with an intermediate insulating element which is made of electrically conductive material capable of compensating for the different thermal coefficients of expansion of the base metal and the semiconductor element. Attachment of the semiconductor element to this intermediate body, as well as of the intermediate body to the base, is for example by a solder connection.

Semiconductor structures are also known in which the metallic base, soldered to the semiconductor element, forms a flat, large-surface electric terminal of the semiconductor to the base element. The upper side of the plate-like semiconductor element has surface terminal connections secured thereto which are located on geometrically precisely defined areas of the semiconductor plate element. These terminal connections may include electrical connecting wires with a bonding connection, leading to further terminal conductors of the semiconductor element. In one form, such terminal conductors may be connecting pins which pass through the base structure or other portions of the housing, being sealed therethrough, for examples by glass-to-metal seals. The connecting wires, usually called "bonding wires", can be attached to the semiconductor element either by soldering or by bonding technology.

In order to provide for predetermined orientation of the connecting zones on the semiconductor element with respect to the connecting pins, it is necessary to locate the semiconductor element in the housing or on its support substrate, or on the base of the housing, by means of a templet.

It has been proposed—see U.S. Pat. No. 3,720,999—to connect bonding terminal connections from the semiconductor element to the external connecting pins by soldering bonding connectors to the connecting pins, and to make the connecting or bonding conductors of a material which is springy or resilient, and to utilize the resilient characteristics of the bonding connection to resiliently press the semiconductor element on its base during the soldering process. This arrangement permits placement of the semiconductor element on the base by use of a templet which can be removed before the soldering process is initiated. It has been found that problems arise if the templet is left in place during the soldering process, so that the proper location of the semiconductor element or body is insured—see, for example, U.S. Pat. Nos. 3,689,985, 3,715,633, and 3,711,752. Methods of this type, as described in the above-mentioned three methods, are suitable only if the disk or plate-like semiconductor body and the terminals secured to its top side are of comparatively large surface area, so that the positioning of the semiconductor with respect to its base does not require accurate positioning. Sliding or other movement of the semiconductor element after removal of the templet, that is, before or during the soldering process, cannot be reliably excluded, however. Some semiconductors are quite small, or have a multiplicity of connecting leads extending from the top surface thereof. If the connecting leads or wires are applied by bonding technology—see, for example, U.S. Pat. No. 4,128,802—the bonding wieres can be applied only after the semiconductor element is soldered to the base support. Bonding is the preferred technology if the semiconductor element is small, or has to be connected with a multiplicity of terminals to external contacts or terminal elements. Since the bonding wires can be applied only after attachment of the semiconductor chip or element to its substrate, they cannot be used to locate the semiconductor chip on the base or substrate during the soldering process. Consequently, it is necessary to leave a templet which positively locates the semiconductor chip or plate on the base during the soldering process and remove it only after soldering. Removal of the templet or positioning die, however, causes problems. If, during soldering, the semiconductor plate or chip floats and migrates towards the templet, subsequent cooling may cause an interengagement of the semiconductor with the templet, and, upon removal of the templet, fractures of the crystalline structure of the semiconductor may result which interfere with blocking capability and the electrical function of the semiconductor plate.

THE INVENTION

It is an object to provide a semiconductor which can be precisely positioned on a support carrier or subtrate, for example a base of a housing or an intermediate metallized ceramic insulator, and in which possible damage to the semiconductor chip due to removal of a templet or locating die is effectively avoided.

Briefly, the templet or positioning die is made of a material which can be soldered to the support element or base of the semiconductor and, after soldering of the semiconductor, left in place. The positioning templet and the substrate or support carrier, which may be the base of a semiconductor structure or an intervening insulator, can be formed with interengaging locating elements, such as ridges and grooves, bumps and holes, or the like, or can be placed within an external holding structure which may, but need not be, removable. The templet itself is formed with an opening, dimensioned and shaped to receive a plate-like semiconductor element, and to locate the semiconductor element therein on its support or carrier structure. Upon introduction of the assembly of the carrier structure, templet and semiconductor element, with suitable solder, into a soldering furnace, the semiconductor element will be soldered on its support carrier, held in place during the flowing or liquid phase of the solder by the positioning templet which, in turn, is secured in position. The positioning templet, likewise, will be soldered to the support carrier and will remain within the semiconductor structure.

The semiconductor, and the method of manufacture thereof, has the advantage that possible jamming of the plate-like semiconductor element during and subsequent to the soldering process, and during the subsequent cooling, will not cause any damage to the semiconductor since, in contrast to the previously used templet, the templet the is not removed but, rather, will remain a portion of the semiconductor element which, then, can be suitably connected and placed into a housing. The templet, since it is not removed, may be termed a "lost templet". This "lost templet" may be adjusted in position on the support carrier or substrate for the semiconductor element and the lost templet by an external locating die. If this external locating die is removed after cooling of the solder, and any damage occurs due to the removal operation, such damage will then arise at the edge of the lost templet, but not on the semiconductor element; edge damage to the lost templet is irrelevant with respect to the operation of the semiconductor element. The method results in structures which can be made with substantially fewer rejects than heretofore, thus substantially improving the efficiency of manufacture and lowering the overall cost.

DRAWINGS

DETAILED DESCRIPTION

Figure 1:
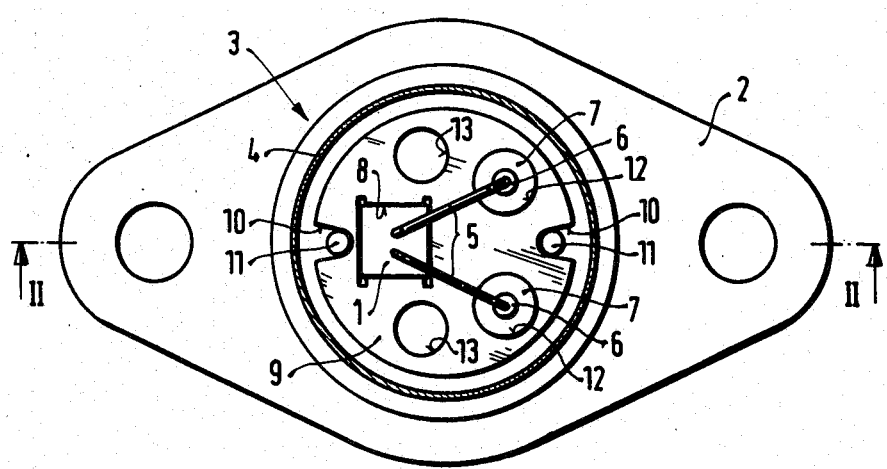
FIG. 1 is a top view of a semiconductor structure, in which a top cover cap has been cut off, so that the interior of the structure, within a cover cap, is visible.
Figure 2:
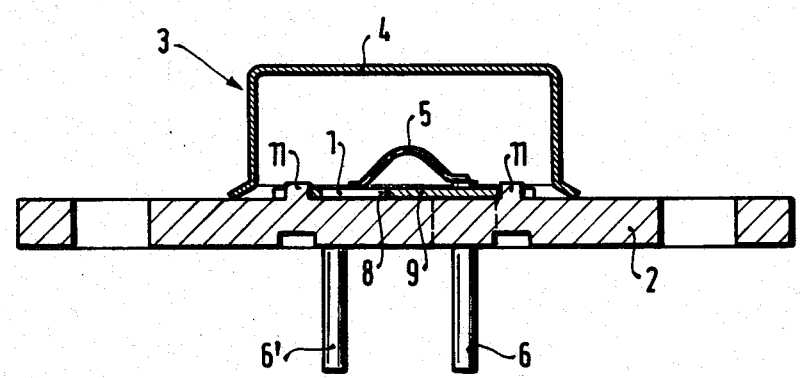
FIG. 2 is a sectional view along line II—II of FIG. 1.

Referring first to FIGS. 1 and 2: The semiconductor is illustrated as a transistor having a plate or disk-like semiconductor body or semiconductor element 1. The transistor, as shown, is of a "power transistor" type, and may, for example, be designed to carry a considerable amount of current, for example to control current flow and suddenly interrupt current flow to the ignition coil of an Otto-type internal combustion engine.

The bottom, plate-like surface of the semiconductor 1 forms one terminal connection of the semiconductor, for example the collector, which extends over the entire bottom surface of the semiconductor body. The semiconductor body is soldered to a metallic base 2, forming part of a housing 3 for the semiconductor element and, at the same time, the collector terminal for the transistor which includes the semiconductor body 1. The housing 3 is closed by a cover cap 4, welded on the metallic base 2. The upper, flat portion of the cover cap 4 has been cut off in the illustration of FIG. 1 to permit viewing of the inside of the semiconductor structure.

The upper major surface of the plate-like semiconductor 1 has two further terminal connecting zones thereon, one forming the emitter terminal and the other the base terminal of the transistor. Bonding wires 5 extend from the respective terminal zones to pin-like connecting conductors 6 which are carried through a glass melt 7 through the plate-like metallic base 2. The pins 6, thus, are insulated from the metallic base 2. A third pin or post-like terminal 6' is provided—seen only in FIG. 2—which is butt-welded on the base 2 to form an external collector terminal for the transistor.

The disk or plate-like semiconductor body or element 1 is fitted into an opening 8 of a solder templet 9. In accordance with a feature of the invention, the solder templet is made of a metal which can be soldered to the support element for the semiconductor body 1, in the embodiments of FIGS. 1 and 2 the base 2. The solder templet is, likewise, soldered to the support element. The edges of the opening 8 are approximately 0.1 mm longer than the edges of the semiconductor body 1. The lost solder templet 9 is formed with notches 10 at the circumference which are positioned to fit against two projecting bumps or stubs 11, extending from the base 2. By the interengagement of the stubs 11 and the notches 10, the templet 9 is reliably and precisely positioned with respect to the base so that, thereby, the semiconductor element 1 is likewise precisely positioned on the base 2. The notches 10 and the stubs 11 are so arranged with respect to each other that the lost solder templet 9 can be positively positioned on the metallic socket 2 in a precise location. The lost solder templet 9 may have any desired outer shape; as shown in FIGS. 1 and 2, it is circular and concentric with respect to the surrounding cover cap 4. The two notches or recesses 10 are diametrically oppositely positioned on the lost solder templet 9, and the two stubs 11 on the metallic socket are likewise similarly diametrically oppositely positioned.

The arrangement as illustrated is only an example; the notches or recesses 10 can be located at different positions of the circumference, or may be differently formed; they may, also, be located within the external outline of the templet, for example in the form of punched holes.

The templet 9 has not only the opening 8 for the semiconductor formed therein but, additionally, openings for the pin-like connecting conductors 6, sufficiently large to permit the glass-to-metal seal 7 to pass through the opening, with clearance, to reliably prevent any possibility of an internal short circuit.

The lost solder templet 9 has two further openings 13 formed therein, located in the vicinity of the opening 8 which is to receive the semiconductor body 1. The openings 13 are provided to permit insertion and placement of solder plugs which form the supply of solder to solder together the plate or disk-like semiconductor body 1, the lost solder templet 9 and the metallic base 2.

METHOD OF MANUFACTURE

The base 2, made of metal, is formed with the stubs 11, and with bores or openings for the glass melts. The post-like conductor 6' is butt-welded on the bottom of the base 2. Thereafter, the entire surface of the base, including the butt-welded connecting post 6', is coated with a corrosion-resistant solderable metallic cover, for example nickel. The post-like connecting pins 6 are then secured in the openings provided therefor within the metallic base 2, by securing the pins in a glass-melt seal 7, thereby carrying the pins 6, insulated, through the base 2.

The lost solder templet 9, preferably a sheet of thin copper, and suitably punched to form the recesses or notches 11 and the holes therein, including the opening 8, is then nickel-plated and fitted on the base 2, adjusting the position thereof on the base by engaging the stubs 11 of the base 2 within the recesses or notches 10. This reliably and precisely locates the solder templet on the base 2. The disk or plate-like semiconductor element 1 is then fitted into the opening 8, and solder plugs or solder disks—not seen in FIGS. 1 and 2—are placed in the holes 13 of the templet. The thus-assembled semiconductor subassembly is introduced into a solder furnace.

The solder furnace is heated to a temperature sufficient to melt the solder of the solder plugs in the openings 13. The melting solder migrates, by capillary force, beneath the solder templet 9 and beneath the disk-like semiconductor element 1 and, simultaneously, solders the semiconductor body 1 and the templet 9 to the metallic base 2.

The now-assembled semiconductor subassembly, i.e. base, semiconductor element and templet is removed from the solder furnace. Bonding wires are then attached to the respective emitter and base zones on the top major surface of the semiconductor element 1 and connected and bonded to the pins 6 extending through the base 2. The connection of the bonding wires 5 to the semiconductor may be by any well known and suitable process, for example bonding or soldering; the connection to the terminal posts 6 may be by any suitable and well known connecting technology, for example welding, bonding or the like.

The entirely assembled and wired semiconductor element is then closed off by placing a cover cap 4 thereover, and welding the cover cap closed to the base 2.

The invention is not limited to the arrangement as shown and described; a plurality of semiconductor bodies or chips can be soldered simultaneously to the metallic base 2 by using a single lost solder templet, which is suitably formed to have reception openings for all the respective semiconductor bodies and for the respective connection pins. Further, it is entirely possible to insulate the semiconductor element as well as the lost solder templets with respect to the metallic base 2. For example, an insulating plate, for example a ceramic which is metallized at its major surfaces, can be soldered between the semiconductor body and the base 2, so that the support element for the semiconductor body then will be the combination of the ceramic and the base 2.

Figure 3:
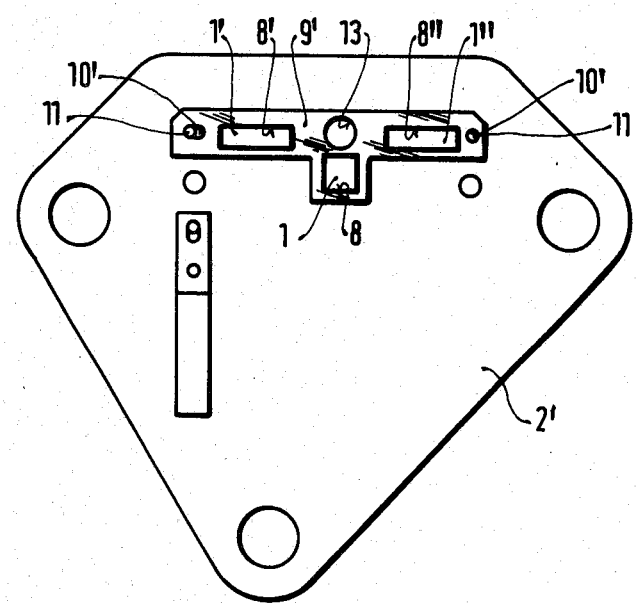
FIG. 3 is a top view of a templet to locate and solder a semiconductor element, and showing a different embodiment.

Embodiment of FIG. 3: Three plate or disk-like semiconductor bodies 1, 1', 1" are secured to a common metallic base by use of a single lost solder templet 9'. The solder templet 9' is formed with three openings 8, 8', 8" to receive the respective semiconductor plates 1, 1', 1". The templet is located and adjusted with respect to the base by engaging holes 10' additionally formed in the templet 9' with suitable stubs 11 located on the base 2'. A single opening 13 is provided to receive a solder plug.

Figure 4:
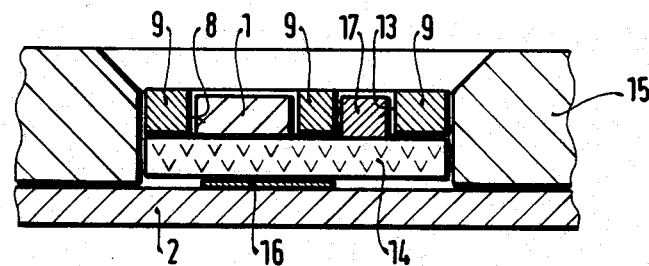
FIG. 4 is a vertical section through an assembled semiconductor structure on an insulator, prior to soldering, and illustrating the location of the respective elements with respect to each other.
Figure 5:
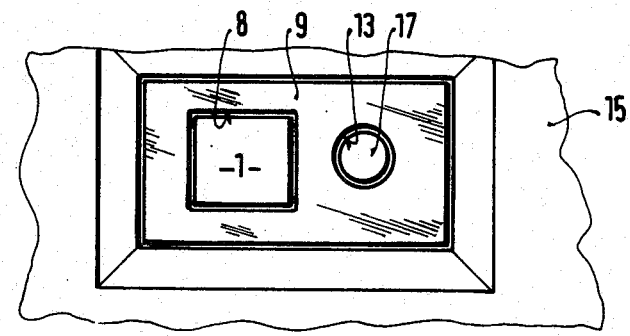
FIG. 5 is a top view of the arrangement of FIG. 4.

Embodiment of FIGS. 4 and 5: The plate or disk or chip-like semiconductor element 1, again, is arranged to form a transistor. Its major plane, at the bottom, forms a collector terminal which, however, is insulated from the metallic base 2. The major plane of the plate-like semiconductor is soldered to a ceramic plate 14 made of beryllium oxide, metallized on both sides, which is inserted between the lost solder templet 9 and the semiconductor 1 on the one hand, and the socket 2 on the other. The metallization of the ceramic plate 14—which can be done in accordance with any well known and standard procedure—may include a top layer of gold.

Method of making the semiconductor, with reference to FIGS. 4 and 5: First, the metallic base 2 has an overall templet 15 applied thereto, located with respect to the base 2, for example, by suitable interengaging projection-and-recess means, by external locating elements or the like. The templet 15 is formed with a large opening. First, a solder disk 16 is placed on the base 2, within the opening of the templet 15, and thereafter the ceramic plate 14 is positioned on the solder disk 16 which, thus, engages the top side of the solder disk 16. The ceramic disk 14 essentially completely fills the opening within the templet 15, except for a narrow clearance space. The lost solder templet 9 is then placed on the ceramic plate 14. The external dimensions of the lost solder templet match those of the ceramic plate 14. The templet 9 has the opening 8 for the semiconductor element 1 and, further, the opening 13 for an additional solder plug 17. The templet 9 is positioned with respect to the plate 14, as before, for example by interengaging projection-and-recess elements. After insertion of the solder plug 17, the preassembled structure is passed into a soldering furnace, in which the solder plug 17 as well as the solder disk 16 are melted, as described above, thereby soldering together the ceramic disk 14 to the base 2, and the semiconductor element 1 as well as the templet 9 to the top metallized surface of the ceramic disk 14.

After cooling, the outer templet 15 can be removed. No damage will result to the semiconductor element 1, even if there should have been some oozing of solder laterally towards the templet 15. Any damage that might occur would only arise at the corners of the lost templet 9, which will not affect the integrity of the semiconductor element 1. The solder templet, thus, has the additional function of protecting the semiconductor element.

The opening 13 in the lost solder templet 9 is not absolutely necessary since, instead of using a solder plug 17, a solder disk is used which, similar to disk 16, is positioned beneath the lost solder templet 9; alternatively, the solder templet 9 and/or the semiconductor element 1 may be pre-coated with solder so that, upon introduction into the soldering furnace, the solder will melt and solder together the lost solder templet 9 as well as the semiconductor body 1 to the metallized coating on the top major surface of the ceramic element 14.

In contrast to the embodiment of FIGS. 1 and 2, the semiconductor element 1 in insulated from the metallic base 2 by the ceramic plate 14. This, then, requires a connection from the bottom side of the semiconductor element 1, forming the collector terminal, as well as of the top side electrodes, the base and emitter terminal, to a terminal post. The lost solder templet 9 may be used to make this connection. A metal wire, for example a thin metal wire, can then be connected to the lost solder templet 9 to form a terminal connection lead for the collector, similar to the bonding wires 5—see FIGS. 1 and 2—connecting the emitter and base terminals of the semiconductor. The metal wire may be attached to the lost solder templet 9 in any suitable manner; if bonding technology or welding is used, the lost solder templet 9 is preferably covered with a thin layer of aluminum or nickel before soldering; if the connection of the connecting wire is to be by soldering, nickel, only, is preferred as the top layer of the lost solder templet.

Figure 6:
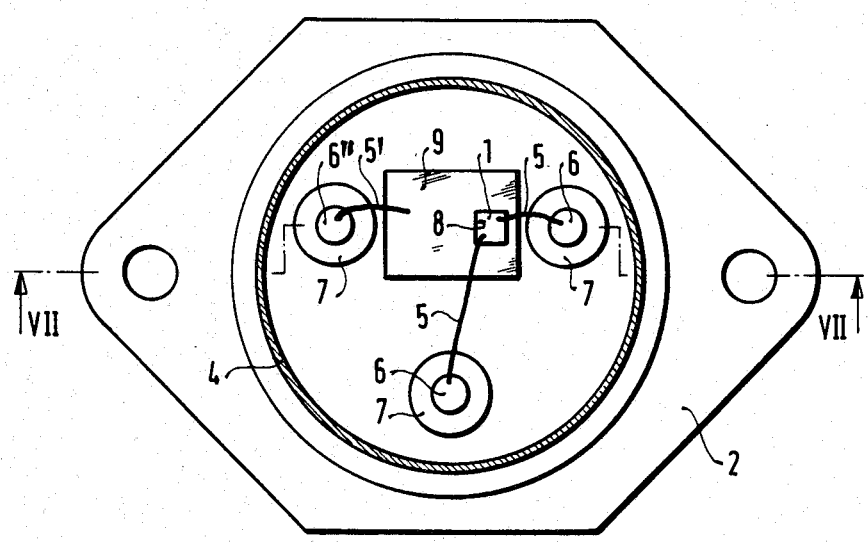
FIG. 6 is a top view similar to FIG. 1, illustrating another embodiment of the invention.
Figure 7:
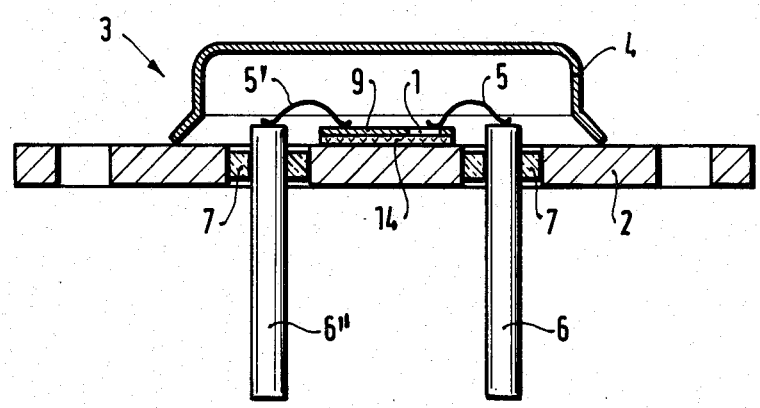
FIG. 7 is a cross-sectional view along line VII—VII of FIG. 6.

The semiconductor structure made in accordance with the method explained in connection with FIGS. 4 and 5, is shown, for example, in FIGS. 6 and 7. All external connections extend from the top side of the semiconductor element 1, and the lost solder templet 9, respectively, and form a complete semiconductor system. Similar to the embodiment shown in FIGS. 1 and 2, bonding wires 5 extend from the emitter and base zones of the semiconductor element to pin or post-like terminals 6 which are carried through the base 2 by insulating beads. In contrast to the embodiment shown in FIGS. 1 and 2, the collector is also connected by means of a bonding wire, shown at 5', which extends from the lost solder templet 9 to the pin or post conductor 6" which, similar to the other pin connectors 6, are carried by glass-melt insulation 7 through the base plate 2.

Various changes and modifications may be made, and any features described herein in connection with any one of the embodiments may be used with any of the others, within the scope of the inventive concept.

We claim:

1. Semiconductor structure having
 a plate-like semiconductor element (1);
 a carrier structure (2, 14) having a solderable surface;
 the plate-like semiconductor element (1) being soldered to the carrier structure on one major surface of the plate-like element;
 at least one geometrically defined electrical connection zone formed on the other major surface of the plate-like semiconductor element;
 a housing (3) enclosing the plate-like semiconductor element; and
 at least one connection conductor (6, 4") insulatingly sealed through the housing, and having a portion extending inwardly of the housing, connected to the at least one connection zone;
 and comprising, in accordance with the invention,
 a wire (5) interconnecting element (1) and conductor (6,6");
 a positioning templet (9) formed with an opening (8) dimensioned and shaped to receive the plate-like semiconductor element (1) therein with sufficient clearance to prevent collision between said templet (9) and said semiconductor element (1) during simultaneous soldering of said templet (9) and said element (1) to said carrier (2) and during differential thermal expansion and contraction of said templet (9) and element (1), located on the carrier structure (2, 14), and having a solderable surface which is soldered to the carrier structure (2, 14), the positioning templet being a plate-like structure, and the opening (8) being located inwardly of the edge of said plate-like templet structure (9) to approximately position and to protect the plate-like semiconductor element (1) within the opening (8); and
 interfitting means (10, 10'; 11) located, respectively, on the positioning templet (9) and on the carrier structure (2,14), thereby positively positioning said templet (9) and carrier structure (2,14) with respect to each other.

2. Semiconductor structure according to claim 1, wherein (FIGS. 4–7) the carrier structure comprises an electrically insulating material (14) having a solderable surface formed thereon, the solderable surface being soldered to the plate-like semiconductor element and to the positioning templet.

3. Semiconductor structure according to claim 2, wherein the carrier structure comprises ceramic.

4. Semiconductor structure according to claim 2, wherein the carrier structure comprises a plate-like element of beryllium oxide having a metallized major surface.

5. Semiconductor structure having
 a plate-like semiconductor element (1);
 a carrier structure (2, 14) having a solderable surface;
 the plate-like semiconductor element (1) being soldered to the carrier structure on one major surface of the plate-like element;
 at least one geometrically defined electrical connection zone formed on the other major surface of the plate-like semiconductor element;
 a housing (3) enclosing the plate-like semiconductor element; and
 at least one connection conductor (6, 6") insulatingly sealed through the housing, and having a portion extending inwardly of the housing, connected to the at least one connection zone;
 and comprising, in accordance with the invention,
 a positioning templet (9) formed with an opening (8) dimensioned and shaped to receive the plate-like semiconductor element (1) therein with sufficient clearance to prevent collision between said templet (9) and said semiconductor element (1) during simultaneous soldering of said templet (9) and said element (1) to said carrier (2) and during differential thermal expansion and contraction of said templet (9) and element (1), located on the carrier structure (2, 14), and having a solderable surface which is soldered to the carrier structure (2, 14);
 wherein the positioning templet is a plate-like structure, and the opening (8) is located inwardly of the edge of said plate-like templet structure (9) to project the plate-like semiconductor element (1) within the opening, and
 further including a metal base plate (2), the carrier structure (14) being bonded to the metal base plate (2);
 the positioning templet (9) being soldered to a metal surface of the carrier structure (14) and formed an electrical terminal for the semiconductor element (1); and
 a connection conductor (6") extending through the base plate (2) and electrically connected with the positioning templet (9) interiorly of the housing (3).

6. Semiconductor structure according to claim 1, wherein the carrier structure comprises a base plate (2); and the interfitting means comprise projection-and-recess means formed, respectively, on the base plate (2) and on the positioning templet (9) for positively positioning the positioning templet with respect to the base plate (2).

7. Semiconductor structure according to claim 1, wherein said interfitting
 means which comprise at least two projections or stubs, projecting from the carrier structure (2, 14);
 and recesses (10, 10') formed in the positioning templet (9) and interengaging with the projecting stubs or bumps for positively positioning the positioning templet with respect to the carrier structure, and hence the semiconductor element with respect to the carrier structure.

8. Semiconductor structure according to claim 1, wherein (FIG. 3) a plurality of plate-like semiconductor elements are included within a single housing;

and a single, common positioning templet (9) is provided formed with a plurality of individual openings (8, 8', 8''), one for each individual semiconductor element (1, 1', 1''), the individual semiconductor elements being fitted in the respective openings (8, 8', 8'').

9. Semiconductor structure according to claim 1, further including electrical connecting wires (5) comprising thin metallic wires extending from said geometrically defined electrical connection zones of the semiconductor element (1) to the portion of the at least one connection conductor extending inwardly of the housing (3).

10. Semiconductor according to claim 9, including a weld bond connection between the thin metal wire (5, 5') with the respective electrical connection zone.

11. Semiconductor according to claim 9, including a solder connection of the thin metal wire (5, 5') with the respective electrical connection zone.

12. Semiconductor structure having
a plate-like semiconductor element (1);
a carrier structure (2, 14) having a solderable surface;
the plate-like semiconductor element (1) being soldered to the carrier structure on one major surface of the plate-like element;
at least one geometrically defined electrical connection zone formed on the other major surface of the plate-like semiconductor element;
a housing (3) enclosing the plate-like semiconductor element; and
at least one connection conductor (6, 6'') insulatingly sealed through the housing, and having a portion extending inwardly of the housing, connected to the at least one connection zone;

and comprising, in accordance with the invention,
a positioning templet (9) formed with an opening (8) dimensioned and shaped to receive the plate-like semiconductor element therein with sufficient clearance to prevent collision between said templet (9) and said semiconductor element (1) during simultaneous soldering of said templet (9) and said element (1) to said carrier (2) and during differential thermal expansion and contraction of said templet (9) and element (1), located on the carrier structure, and soldered to the carrier structure;

and positioning means, engageable by the templet, located within the housing for positioning the templet in predetermined position in the housing, inwardly of the solder connection between the templet and the carrier structure, and hence positively locating the plate-like semiconductor element in the housing even before the solder between the plate-like element and the carrier structure has solidified.

13. The semiconductor structure of claim 1, wherein the edge of said opening (8) are approximately 0.1 mm longer than the edges of said semiconductor element (1).

14. The semiconductor structure of claim 12, wherein the edges of said opening (8) are approximately 0.1 mm longer than the edges of said semiconductor element (1).

* * * * *